(12) United States Patent
Liu et al.

(10) Patent No.: US 8,626,092 B2
(45) Date of Patent: Jan. 7, 2014

(54) LOW VARIATION CURRENT MULTIPLIER

(75) Inventors: Hui Liu, Cedar Rapids, IA (US); Duane A. Green, Hiawatha, IA (US); David Anthony Sawatzky, Lisbon, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 13/559,275

(22) Filed: Jul. 26, 2012

(65) Prior Publication Data

US 2013/0029620 A1 Jan. 31, 2013

Related U.S. Application Data

(60) Provisional application No. 61/512,857, filed on Jul. 28, 2011.

(51) Int. Cl.
| | |
|---|---|
| *H04B 1/04* | (2006.01) |
| *H03G 3/10* | (2006.01) |
| *G05F 1/10* | (2006.01) |
| *H03G 3/30* | (2006.01) |

(52) U.S. Cl.
CPC ............ *H03G 3/3042* (2013.01); *H04B 1/0475* (2013.01)
USPC ...................... 455/127.1; 455/127.2; 455/126; 455/114.3; 330/285; 330/127; 327/538

(58) Field of Classification Search
USPC ............. 455/126, 127.1, 127.2, 114.3, 115.1; 330/127, 273, 285, 296; 327/530, 535, 327/538
See application file for complete search history.

(56) References Cited

U.S. PATENT DOCUMENTS

| | | | |
|---|---|---|---|
| 4,300,019 A | 11/1981 | Toyomaki | |
| 4,956,567 A * | 9/1990 | Hunley et al. | 327/540 |
| 5,796,243 A | 8/1998 | Kimura | |
| 6,166,591 A * | 12/2000 | Schultz et al. | 327/544 |
| 6,745,016 B2 * | 6/2004 | Iwata et al. | 455/234.1 |
| 6,861,890 B2 * | 3/2005 | Gilbert | 327/349 |
| 7,057,440 B2 | 6/2006 | Yang et al. | |
| 7,197,286 B2 * | 3/2007 | Ode et al. | 455/114.3 |
| 7,317,412 B2 * | 1/2008 | Li et al. | 341/144 |
| 7,340,223 B1 * | 3/2008 | Wright et al. | 455/91 |
| 7,872,372 B1 | 1/2011 | Voo | |
| 7,902,901 B1 * | 3/2011 | Roger | 327/349 |
| 8,489,044 B2 * | 7/2013 | Oliaei et al. | 455/114.3 |
| 2007/0262893 A1 * | 11/2007 | Li et al. | 341/144 |
| 2012/0094727 A1 * | 4/2012 | Morimoto et al. | 455/571 |

OTHER PUBLICATIONS

Search Report and Written Opinion of Jan. 29, 2013 for International Application No. PCT/US2012/048399 filed Jul. 26, 2012. 8 Pages.

* cited by examiner

*Primary Examiner* — Duc M Nguyen
(74) *Attorney, Agent, or Firm* — Knobbe, Martens, Olson & Bear, LLP

(57) ABSTRACT

Aspects of the present disclosure relate to a current multiplier that can generate an output current with high linearity and/or high temperature compensation. Such current multipliers can be implemented by complementary metal oxide semiconductor (CMOS) circuit elements. In one embodiment, the current multiplier can include a current divider and a core current multiplier. The current divider can generate a divided current by dividing an input current by an adjustable division ratio. The division ratio can be adjusted, for example, based on a comparison of the input current with a reference current. The core current multiplier can generate the output current based on multiplying the divided current and a different current. According to certain embodiments, the output current can be maintained within a predetermined range as the input current to the current divider varies within a relatively wide range.

23 Claims, 6 Drawing Sheets

LOW VARIATION CURRENT MULTIPLIER

CROSS-REFERENCE TO RELATED APPLICATION

This application claims the benefit under 35 U.S.C. §119 (e) of U.S. Provisional Patent Application No. 61/512,857 filed on Jul. 28, 2011, titled "LOW VARIATION CMOS CURRENT MULTIPLIER WITH HIGH TEMPERATURE COMPENSATION AND HIGH LINEARITY," the disclosure of which is hereby incorporated by reference herein in its entirety.

BACKGROUND

1. Technical Field

The disclosed technology relates to electronic systems and, more particularly, to circuits configured to multiply currents.

2. Description of the Related Technology

Electronic systems can use current multipliers to multiply two or more currents in a variety of applications, such as in a power amplifier controller. Certain current multipliers can receive three input currents and generate an output current proportional to the product of two of the input currents divided by the other input current.

It can be desirable to have good linearity of the output current in the presence of variations in an electronic system. For instance, it can be desirable to have good linearity of the output current as one or more of the input currents vary, as temperature of the current multiplier varies, as supply voltage of the current multiplier varies, in the presence of process variations, or any combination thereof. In certain implementations, as one of the inputs to the current multiplier varies, temperature compensation can become more difficult, for example, due to two or more of these parameters working against each other.

In a power amplifier module that includes a power amplifier controller having a current multiplier, any of the variations described herein can cause gain variations, gain slope issues, impact other metrics by which power amplifier modules are rated, or any combination thereof. Accordingly, such variations can make designing a power amplifier module that meets a design specification more difficult.

Moreover, when implementing current multipliers in complementary metal oxide semiconductor (CMOS) technology, yields can be relatively low. Low yields increase costs of manufacturing dies that include such current multipliers.

SUMMARY OF CERTAIN INVENTIVE ASPECTS

The innovations described in the claims each have several aspects, no single one of which is solely responsible for its desirable attributes. Without limiting the scope of this invention, some prominent features will now be briefly discussed.

One aspect of this disclosure is a current multiplier that includes a compare circuit, a current divider, and a core current multiplier. The compare circuit is configured to compare a first current from a first current source with a reference current and generate one or more compare signals based on comparing the first current from the first current source with the reference current. The current divider is configured to adjust a division ratio based on at least one of the one or more compare signals and divide a current divider input current by the division ratio to generate a divided output current. The core current multiplier is configured to generate a current multiplier output current based on multiplying the divided output current by a different current.

In some implementations, the current divider input current can be based on the first current.

The current multiplier can be implemented with complementary metal oxide semiconductor (CMOS) circuit elements on a CMOS die, according to a number of implementations.

In accordance with certain implementations, the current multiplier can be implemented in a power amplifier control circuit. According to some of these implementations, the power amplifier control circuit can be configured to select one of a plurality of different modes of the power amplifier based on at least one of the one or more compare signals.

The current multiplier can also include a second current divider configured to adjust a second division ratio based on at least one of the one or more compare signals and generate the different current based on dividing current from a second current source by the second division ratio, according to certain implementations.

In certain implementations, the current multiplier can also include a second current divider configured to adjust a second division ratio and generate the different current, in which the core current multiplier is configured to generate the current multiplier output current based on the product of the first divided output current and the second current divided by a third current. According to some of these implementations, the current multiplier can also include a third current divider configured to adjust a third division ratio and generate the third current based on dividing current from a third current source by the third division ratio.

In accordance with various implementations, the first current can be configured to vary by at least about two orders of magnitude. Alternatively or additionally, the current multiplier can be configured to maintain a linearity of the output current within +/−3% across the range of the first current. According to a number of implementations, the current multiplier can be configured to perform temperature compensation of about 5% to 60% on the output current.

In certain implementations, the compare circuit can include a Schmitt trigger configured to compare the first current with the reference current.

According to some implementations, the compare circuit can also be configured to compare the first current with a second reference current and generate the one or more compare signals based on comparing the first current with the second reference current, the second reference current being independent of the first current source.

In accordance with various implementations, the current divider can include a current mirror configured to decode a current range of the first current.

Another aspect of this disclosure is a power amplifier module that includes a power amplifier die including a power amplifier configured to amplify an input signal and to generate an amplified output signal. The power amplifier module also includes a complementary metal oxide semiconductor (CMOS) controller die. The CMOS controller die includes a current divider configured to adjust a division ratio based on a comparison of a first current from a first current source and a reference current and generate a divided current based on the division ratio; and a core current multiplier configured to generate an output current based on multiplying the divided current by a current generated based on a second current source. The power amplifier on the power amplifier die is configured to be biased based on the output current of the core current multiplier.

In some implementations, the power amplifier includes a GaAs transistor.

According to certain implementations, a mode of the power amplifier is configured to be selected based on the comparison and at least one of a mode select signal and a band select signal.

In accordance with a number of implementations, the CMOS controller die can also include a second current divider configured to adjust a second division ratio based on a comparison of the first current from the first current source and a second reference current and generate a second divided current based on dividing the second current by the second division ratio.

In various implementations, the current divider can also configured to adjust the division ratio based on a second comparison of the first current from the first current source and a second reference current.

Another aspect of this disclosure is a method of multiplying current that includes comparing current from a first current source to a reference current; adjusting a division ratio of a current divider configured to divide current from the first current source based on the comparing; and multiplying a current generated by the current divider by at least one current generated based on a second current from a second current source separate from the first current source.

Another aspect of this disclosure is a wireless device that includes a battery configured to power the wireless device. The wireless device also includes a power amplifier die configured to amplify a radio frequency (RF) input signal and to generate an amplified RF signal. The wireless device also includes an antenna configured to transmit the amplified RF signal. Additionally, the wireless device also includes a CMOS controller die including a core current multiplier configured to generate an output current by multiplying a first divided current and a second current, and a current divider configured to generate the first divided current by dividing a first current from a first current source by an adjustable division ratio so as to keep the output current of the core current multiplier within a predetermined range as the current from the current source varies.

Yet another aspect of this disclosure is a current multiplier that includes a core current multiplier and a current divider. The core current multiplier is configured to generate an output current based on multiplying a divided current and a different current. The current divider is configured to generate the divided current by dividing a current from a current source by an adjustable division ratio so as to keep the output current of the core current multiplier within a predetermined range as the current from the current source varies.

According to certain implementations, the current divider can be configured keep the output current of the core current multiplier within a predetermined range as the current from the current source varies on the order of at least two orders of magnitude.

Another aspect of this disclosure is a current multiplier that includes a compare circuit, a first current divider, a second current divider, and a core current multiplier. The compare circuit is configured to compare a first current from a first current source with a reference current and generate one or more compare signals based on comparing the first current with the reference current. The first current divider configured to adjust a first division ratio based on at least one of the one or more compare signals and divide the first current by the first division ratio to generate a first divided output current. The second current divider is configured to adjust a second division ratio based on at least one of the one or more compare signals and divide a second current by the second division ratio to generate a second divided output current. The core current multiplier is configured to generate a current multiplier output current based on multiplying the first divided output current by a second divided output current.

The current multiplier can be implemented with complementary metal oxide semiconductor (CMOS) circuit elements on a CMOS die, according to a number of implementations.

In accordance with certain implementations, the current multiplier can be implemented in a power amplifier control circuit. According to some of these implementations, the power amplifier control circuit can be configured to select one of a plurality of different modes of the power amplifier based on at least one of the one or more compare signals.

In certain implementations, the core current multiplier can be configured to generate the current multiplier output current based on the product of the first divided output current and the second current divided by a third current. According to some of these implementations, the current multiplier can also include a third current divider configured to adjust a third division ratio and generate the third current based on dividing current from a third current source by the third division ratio.

In accordance with various implementations, the first current can be configured to vary by at least about two orders of magnitude. Alternatively or additionally, the current multiplier can be configured to maintain a linearity of the output current within +/−3% across the range of the first current. According to a number of implementations, the current multiplier can be configured to perform temperature compensation of about 5% to 60% on the output current.

In certain implementations, the compare circuit can include a Schmitt trigger configured to compare the first current with the reference current.

According to some implementations, the compare circuit can also be configured to compare the first current with a second reference current and generate the one or more compare signals based on whether the first current is greater than the second reference current, the second reference current being independent of the first current source.

In accordance with various implementations, the current divider can include a current mirror configured to decode a current range of the first current.

Another aspect of this disclosure is a power amplifier module that includes a power amplifier die and a complementary metal oxide semiconductor (CMOS) controller die. The power amplifier die includes a power amplifier configured to amplify an input signal and to generate an amplified output signal. The CMOS controller die includes a first current divider configured to generate a first divided current based on dividing a first input current by a first division ratio. The CMOS controller die also includes a second current divider configured to generate a second divided current based on dividing a second input current by a second division ratio. In addition, the CMOS controller die includes a third current divider configured to generate a third divided current based on dividing a third input current by a third division ratio. Additionally, the CMOS controller die includes a core current multiplier configured to receive the first divided current, the second divided current, and the third divided current and generate an output current proportional to the first input current multiplied by the second input current divided by the third input current. The power amplifier on the power amplifier die is configured to be biased based on the output current of the core current multiplier. At least of the first division ratio, the second division ratio, and the third division ratio are configured to be adjusted based on a comparison of the first input current with a reference current.

In some implementations, the power amplifier includes a GaAs transistor.

According to certain implementations, a mode of the power amplifier is configured to be selected based on the comparison and at least one of a mode select signal and a band select signal.

In accordance with a number of implementations, the first input current is configured to vary by at least about one order of magnitude.

The first division ratio, the second division ratio, and the third division ratio can be configured to be adjusted based on the comparison of the first current with the reference current.

In various implementations, at least one of the first division ratio, the second division ratio, and the third division ratio can be configured to be adjusted based on a second comparison of the first current from the first current source and a different reference current.

Another aspect of this disclosure is a wireless device that includes a battery configured to power the wireless device. The wireless device also includes a power amplifier die configured to amplify a radio frequency (RF) input signal and to generate an amplified RF signal. In addition, the wireless device includes an antenna configured to transmit the amplified RF signal. Additionally, the wireless device includes a CMOS controller die. The CMOS controller die includes a core current multiplier configured to generate an output current by multiplying a first divided current and a second divided current. The CMOS controller die also includes a first current divider configured to generate the first divided current by dividing a first current from a first current source by a first adjustable division ratio. In addition, the CMOS controller die includes a second current divider configured to generate the second divided current by dividing a second current from a second current source by a second adjustable division ratio. The CMOS controller die is configured to keep the output current of the core current multiplier within a predetermined range as the current from the first current source varies.

Yet another aspect of this disclosure is a method of multiplying current that includes comparing current from a first current source to a reference current; adjusting a first division ratio of a first current divider configured to divide current from the first current source based on the comparing; adjusting a second division ratio of a second current divider configured to divide current from a second current source based on the comparing; and multiplying a current generated by the first current divider by a current generated by the second current divider.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION

Figure 1:
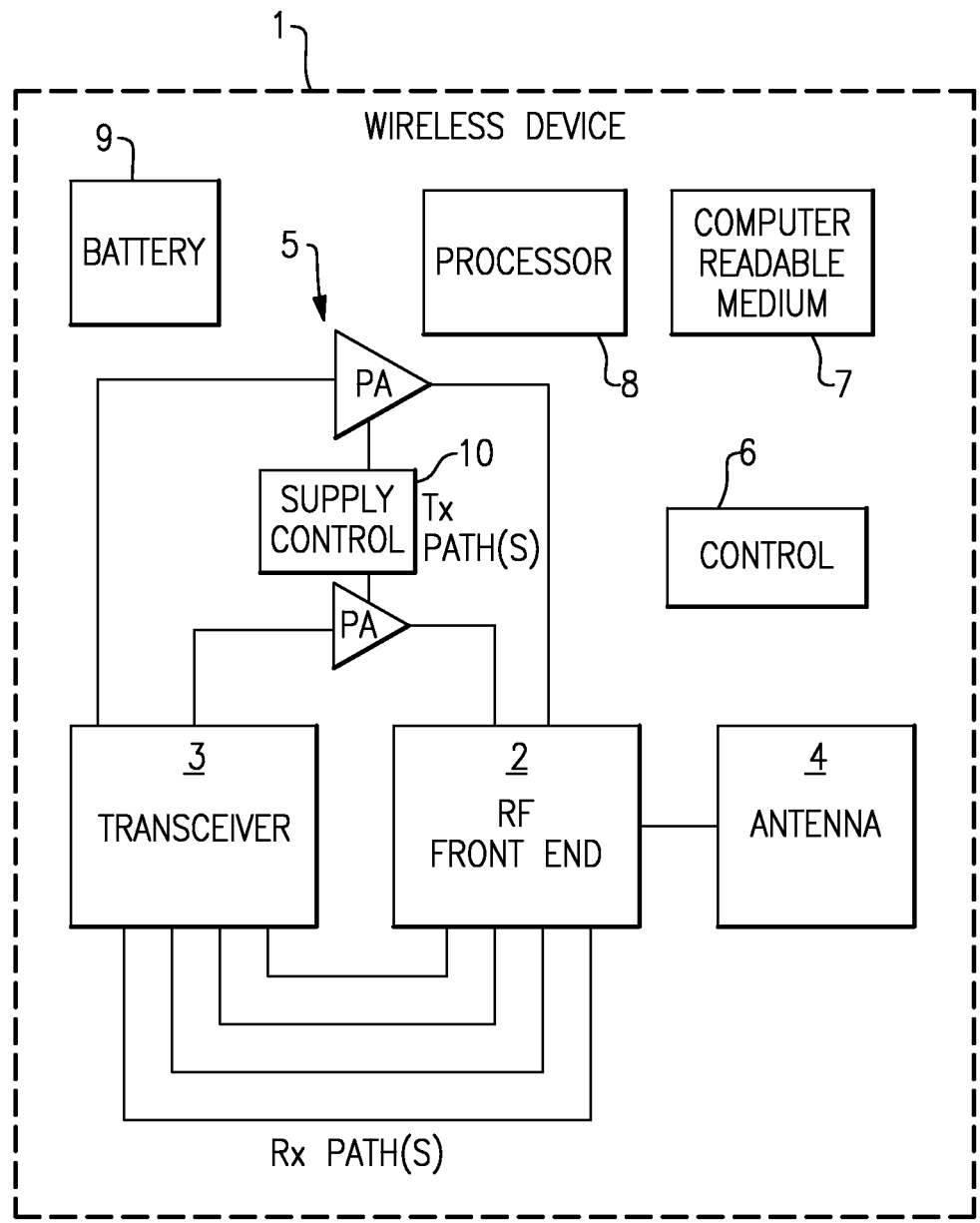
FIG. 1 is a schematic block diagram of an illustrative wireless device.

Generally described, aspects of the present disclosure relate to current multipliers. The current multipliers described herein can be implemented using complementary metal oxide semiconductor (CMOS) technology. The current multipliers described herein can multiply a first current that varies within a relatively wide range by a second current to generate an output current. The output current can be kept within a predetermined range while the first current varies within the relatively wide range (for example, a range that spans at least about two orders of magnitude). This can, for example, maintain a power amplifier bias within a predefined specification. The output current can be kept within the predetermined range by adjusting a division ratio of one or more current dividers coupled to one or more inputs of a core current multiplier. Such adjustment to the division ratio of one or more current dividers can be implemented based on a comparison of the first current and a reference current, for example, using a Schmitt trigger.

Using the systems, apparatus, and methods related to current multiplication described herein, electronic systems, such as power amplifier systems, can be manufactured cost effectively with relatively high yields. Any combination of features of the current multipliers described can be integrated into an existing CMOS die while consuming a relatively small die area. Alternatively or additionally, the current multipliers described herein can be implemented without adding additional fuse pads and/or supporting circuits for a fuse on a die. In certain implementations, a need to develop a subsequent probe, test and blow fuse procedure in production can be eliminated. Accordingly, it can be cheaper, smaller, and less complicated to fabricate and/or achieve a high yield of CMOS dies in accordance with one or more aspects of this disclosure. According to certain implementations, current multipliers can implement additional power amplifier operating modes with the same number of logic control signal inputs (such as one or more mode control signals and/or one or more band select signals), or even with fewer logic control signal inputs.

The headings provided herein are for convenience only and do not necessarily affect the scope or meaning of the claims.
Current Multiplier A current multiplier can be implemented with relatively low cost CMOS technology. This can reduce manufacturing costs compared to a BiCMOS process or other processes that are more expensive than CMOS processes. In addition, yield can be improved in a CMOS current multiplier implementing one or more features described herein compared to comparable conventional CMOS current multipliers. Current multipliers implementing one or more aspects of this disclosure can reap the benefits of a relatively low cost CMOS process while achieving high yields.

As used herein, a current multiplier can refer to a circuit configured to generate a product of two or more currents. Such current multipliers can include other circuit elements that perform other functions than current multiplication. For instance, current multipliers can include one or more compare circuits and/or one or more current dividers. The circuit in the current multiplier that is configured to generate the product of two or more currents can be referred to as a core current multiplier. As discussed herein, the core current multiplier can compute a product of two currents divided by a third current in certain implementations.

FIGS. 3A-3D are block diagrams of illustrative current multipliers according to certain embodiments. The current multipliers 30 shown in FIGS. 3A-3D include a compare circuit 32, one or more current dividers 34, and a core current multiplier 36. Any of current multipliers of FIGS. 3A-3D can be implemented by CMOS circuit elements on a CMOS die.

The compare circuit 32 can compare a first current from a first current source with a first reference current. In accordance with some implementations, the first current can have any combination of features of the first input current $I_1$ described herein. The compare circuit 32 can generate one or more compare signals indicative of whether the first current is greater than the first reference current. As one example, the compare circuit can include a Schmitt trigger that compares the first current with the first reference current. The compare circuit 32 can include logic control, such as digital logic, that generates the one or more compare signals. For instance, the one or more compare signals can be based on an output of the Schmitt trigger.

Figure 3A:
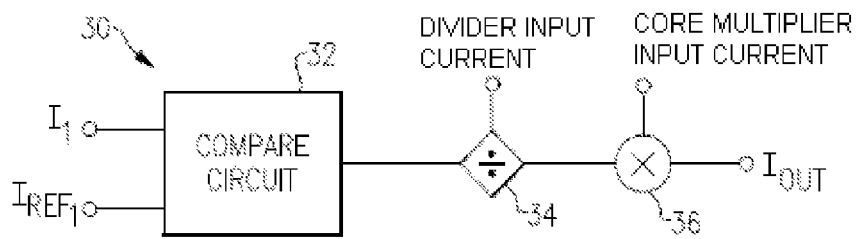
FIGS. 3A-3D are block diagrams of illustrative current multipliers according to certain embodiments.
Figure 3B:
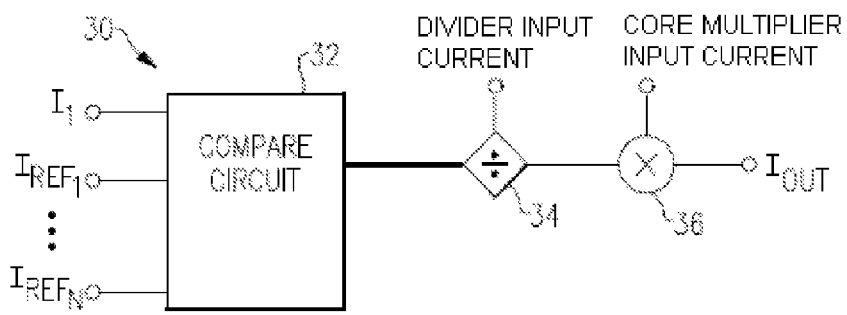
Figure 3C:
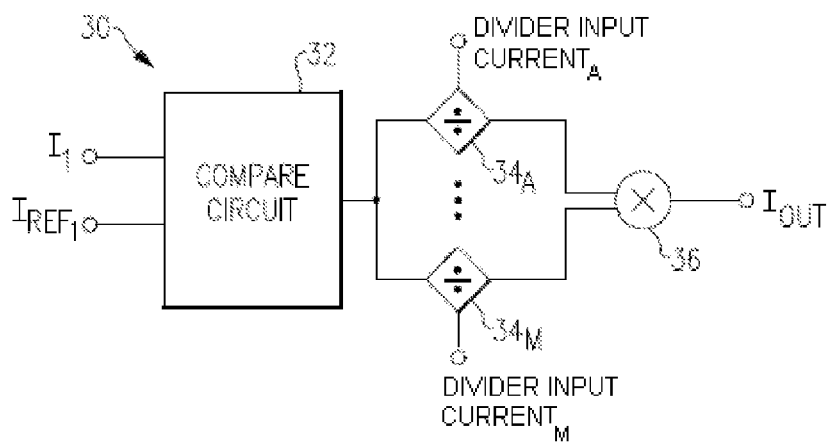
Figure 3D:
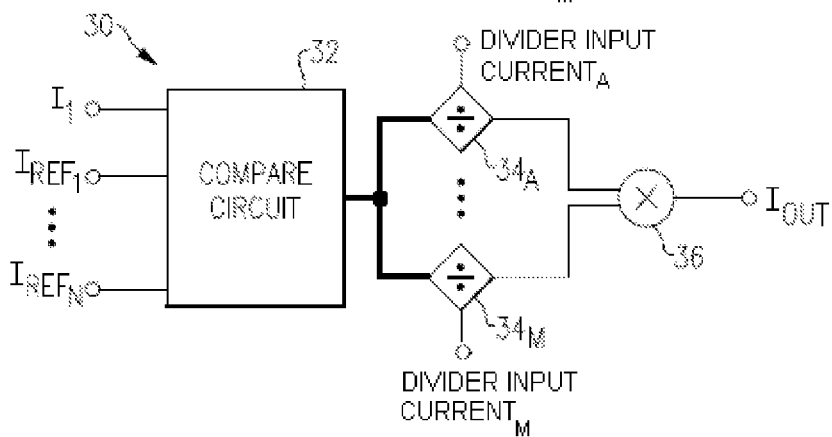

In the current multipliers 30 illustrated in FIGS. 3A and 3C, the compare circuit 32 can compare the first current $I_1$ with a first reference current $I_{REF1}$. In the current multipliers 30 illustrated in FIGS. 3B and 3D, the compare circuit 32 can compare the first current $I_1$ with a plurality of reference currents $I_{REF1}$ to $I_{REFN}$. With two or more reference currents as inputs, the compare circuit 32 of the current multiplier 30 can perform additional comparisons to obtain more data regarding the current level of the first current $I_1$. Logic control can then generate one or more control signals based one or more of the comparisons. As shown by the busses coupled to the outputs of the compare circuits 32 of FIGS. 3B and 3D, with multiple comparisons, a plurality of signals can be provided to one or more current dividers 34. When the compare circuit 32 provides two or more bits of data to a current divider 34, the current divider 34 can be configured to adjust its division ratio among more than two different values. For instance, with two input bits form a compare circuit 32, a current divider 34 can adjust its division ratio to a selected one of four values. Alternatively or additionally, when the compare circuit 32 generates two or more compare signals, different signals can be provided to different current dividers of the current dividers, for example, in the current dividers 34a to 34m of the current multiplier 30 of FIG. 3D. In this way, adjustment of the division ratios of the current dividers 34a to 34m can be tailored based on the comparisons performed by the compare circuit. Any suitable number of comparisons can be performed for a particular application. One or more of the reference currents $I_{REF1}$ to $I_{REFN}$ provided to the current multipliers 30 of FIGS. 3A to 3D can be programmable.

The current divider 34 can divide a current divider input current by a division ratio to generate a divided output current. For instance, when the current divider has a division ratio of k, then the current divider input current can have k times the current of the divided output current. The division ratio can be adjusted based on at least one of the one or more compare signals. In this way, the output of the current multiplier 30 can be adjusted based on the one or more compare signals. In certain implementations, the current divider input current can be the first input current $I_1$. In accordance with some other implementations, the current divider input current can be a different current that is being multiplied by the current multiplier 30, such as the second input current $I_2$ or the third input current $I_3$. For instance, the different current can be a current that the current multiplier 30 multiplies by the first input current $I_1$. As another example, the different current can be a current by which the current multiplier 30 divides the first current $I_1$.

The current multipliers 30 illustrated in FIGS. 3A and 3B include one current divider 34. According to some implementations, the division ratio of two or more current dividers 34 can be adjusted based on the one or more compare signals. The current multipliers 30 of FIGS. 3C and 3D include a plurality of current dividers $34_A$ to $34_M$ that can each adjust a respective division ratio based on one or more compare signals generated by the compare circuit 32. In certain implementations, additional current dividers without adjustable division ratios can be implemented in a current multiplier 30 along with one or more current dividers 34 with adjustable division ratios. As discussed above, the division ratios can be adjusted among two or more different values.

The core current multiplier 36 can generate a current multiplier output current based on multiplying the divided output current from the current divider 34 by a different current. The different current can be generated by a different current divider 34, for example, in accordance with the current multipliers 30 of FIGS. 3C and 3D. In some other implementations, the different current can be provided by a current divider with a division ratio that is not adjusted based on an output of the compare circuit 32. According to some other implementations, the different current can be provided from different circuit elements than a current divider. In accordance with certain implementations, the core current multiplier 36 can receive three inputs and generate an output current that is proportional to the products of two of the three inputs divided by the third input. Accordingly, the different current can be the first input current $I_1$, the second input current $I_2$, the third input current $I_3$, the second divided current $I_2/m$, the third divided current $I_3/n$, or the like.

Current multipliers 30 can be used in a variety of different applications with a need for multiplying currents. For example, any power amplifier control circuit with a need for a current multiplication function can include a current multiplier 30. The power amplifier control circuit can be implemented, for example, in a multimode power amplifier controller. Such a power amplifier controller can be implemented on a separate die than the power amplifier it controls.

Figure 3E:
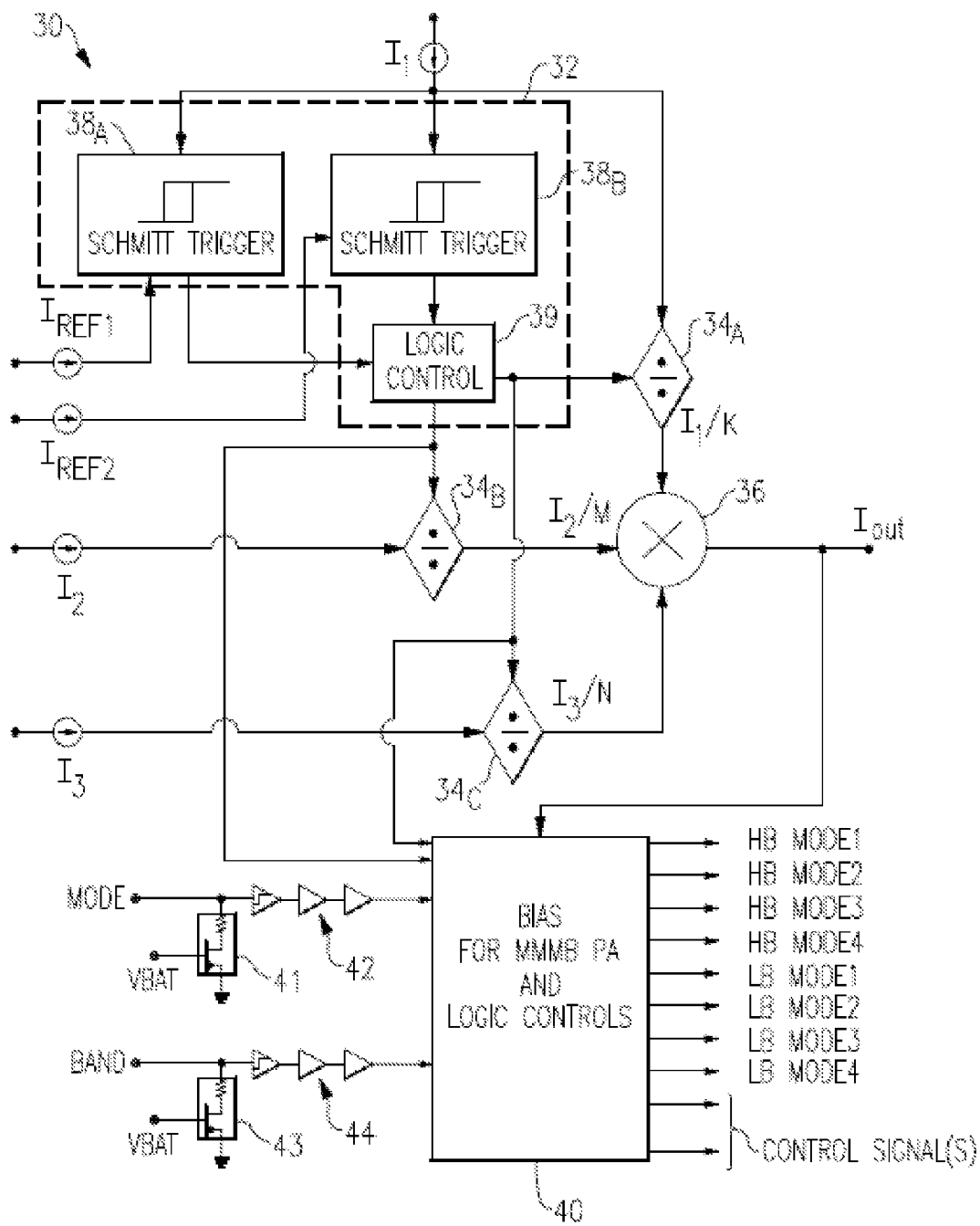
FIG. 3E is a schematic diagram of an illustrative current multiplier according to an embodiment.

In some implementations, such as the current multiplier 30 shown in FIG. 3E, the current multiplier can be configured to receive a first input current $I_1$, a second input current $I_2$, and a third input current $I_3$. Although the current multipliers 30 described herein may be described as having input currents, it will be understood that any of the current multipliers 30 described herein can receive an input voltage and convert the received voltage to any of the input currents described herein. Further, it will be understood that any of the output currents Iout described herein can be converted to an output voltage. The first input current $I_1$ can have a current value that varies within a relatively wide range. In some implementations, the first input current $I_1$ can vary from about 10 uA to 10 mA. The first input current $I_1$ can vary by at least one, two, or three orders of magnitude, according to certain implementations. The second input current $I_2$ can vary with temperature. For example, the second input current $I_2$ can have proportional to the absolute temperature (PTAT) characteristics. The third input current $I_3$ can be indicative of a bandgap current. For instance, the third input current $I_3$ can be proportional to the bandgap voltage divided by a resistance. The output current Iout of the current multiplier 30 can be proportional to the product of the first input current $I_1$ and the second input current $I_2$ divided by the third input current $I_3$. In some implementations, the output current Iout of the current multiplier 30 can be approximately equal to the product of the first input current $I_1$ and the second input current $I_2$ divided by the third input current $I_3$, in accordance with Equation 1.

$$\text{Iout} = I_1 * I_2 / I_3 \quad \text{(Eq. 1)}$$

There can be stringent requirements for the output current Iout of the current multiplier 30 in some implementations. One of the stringent requirements can be linearity. For instance, Iout can deviate from the relationship represented by Equation 1 without compensating for one or more of the variations described herein. Such deviation can result from, for example, second order effects such as channel length modulation, component mismatches, mobility reduction in pure CMOS process, or any combination thereof. Alternatively or additionally, deviation in Iout from the relationship represented by Equation 1 can be exacerbated by the relatively wide range of the first input current $I_1$. It can be desirable for the output current Iout to have good linearity over an entire range of the first input current $I_1$, processes, temperatures, supply voltages, the like, or any combination thereof. Linearity can be proportional to a difference between actual Iout as measured and Iout as calculated from Equation 1. In some implementations, linearity can be represented by the difference between actual Iout as measured and Iout as calculated from Equation 1 divided by actual Iout, which can be represented as a percentage. In some other implementations, linearity can be represented by the difference between actual Iout as measured and Iout as calculated from Equation 1 divided by Iout as calculated by Equation 1, which can be represented as a percentage. An example linearity requirement, represented by dividing the difference between actual Iout and Iout computed by Equation 1 by Iout computed by Equation 1, can be within +/−3% across the range of the first input current $I_1$.

Alternatively or additionally, it can be desirable for the output current Iout to have high temperature compensation. For example, in some implementations, the output current Iout can have a temperature compensation ranging from about 5% to 60% as calculated by Equation 2 below. Temperature compensation TC can be measured, for example, by the following equation:

$$TC = (I_{OUT\,85°\,C.} - I_{OUT\,-15°\,C.}) / I_{OUT\,ROOM\,TEMP} \quad \text{(Eq. 2)}$$

In Equation 2, $I_{OUT\,85°\,C.}$ can represent the output current Iout at 85° C., $I_{OUT\,-15°\,C.}$ can represent the output current Iout at −15° C., and $I_{OUT\,ROOM\,TEMP}$ can represent the output current Iout at room temperature.

However, in CMOS implementations, the output current Iout can vary substantially due to the core current multiplier utilizing the square-law characteristic of a CMOS transistor. Such variation can be exacerbated by implementing high temperature compensation of the output current Iout because temperature compensation, linearity and variation in the output current Iout can be competing design constraints that work against each other.

Variation in the output current Iout can be undesirable. For instance, variation in the output current Iout can cause a low power gain variation of a power amplifier at Wideband Code Division Multiple Access (WCDMA) mode and/or gain slope issues in a power amplifier, among other things. Accordingly, variation in the output current Iout can complicate the design of a power amplifier system at a module level.

In order to ensure power amplifier module performance at an acceptable level, a CMOS die on a wafer can be screened by a probe to accept or reject dies based on certain threshold limits to make sure that only those dies with variations satisfying the threshold limits are selected. As a result, the CMOS wafer yield can suffer significantly due to variation in the output current Iout of some conventional current multipliers. This can increase cost of an end product considerably.

Meeting the stringent requirements of the output current Iout characteristics such as high linearity, low variation, high temperature compensation, or any combination thereof over a wide range of the first input current $I_1$ can be difficult to implement. Typically, it is desirable to meet certain relationships between the first input current $I_1$, the second input current $I_2$, and the third input current $I_3$ for a pure CMOS multiplier to work based on a square-law characteristic. More specifically, in some implementations, it is typically desirable to maintain the relationship in Equation 3 for the first input current $I_1$, the second input current $I_2$, and the third input current $I_3$ across the entire ranges of the first input current $I_1$, the second input current $I_2$ and the third input current $I_3$ over process, temperature and voltage.

$$I_1 + I_2 <= 4 * I_3 \quad \text{(Eq. 3)}$$

In some implementations, current multipliers may be required to maintain the relationship described in Equation 3 to properly function as a current multiplier.

Referring to FIG. 3E, an illustrative current multiplier 30 according to an embodiment will be described. The current multiplier 30 shown in FIG. 3E can overcome one or more of the problems described earlier, among others. For example, the current multiplier 30 shown in FIG. 3E can be implemented in CMOS with a relatively high yield.

The illustrated current multiplier 30 includes a compare circuit 32, a plurality of current dividers 34a-34c, a core current multiplier 36, and a bias and control logic block 40. The compare circuit 32 illustrated in FIG. 3E includes a first Schmitt trigger 38a, a second Schmitt trigger 38b, and logic control 39. The current multiplier 30 can also include input control circuitry configured to process the received mode control and band control signals. As illustrated, the input control circuitry includes pull down transistors 41, 43 and buffer chains 42, 44. The buffer chains 42, 44 can each include a Schmitt trigger as shown in FIG. 3E. In certain implementations, one or more of the current sources shown in FIG. 3E can be considered part of the current multiplier 30. In some other implementations, one or more of the current sources shown in FIG. 3E may not be considered part of the current multiplier 30.

The first input current $I_1$ can be compared to one or more reference currents to generate data on its current level. This data can be used to compensate for variations in the first input current $I_1$ described herein. As shown in FIG. 3E, the first input current $I_1$ can be provided to an input of a first Schmitt trigger 38a of the compare circuit 32. The first Schmitt trigger 38a can generate a first compare signal based on a comparison of the first input current $I_1$ and a first reference current $I_{REF1}$. The first compare signal can be indicative of whether the first input current $I_1$ is greater than the first reference current $I_{REF1}$. The first compare signal can be a binary signal. In some implementations, one or more compare signals can be generated based on the comparison of the first input current $I_1$ and the first reference current $I_{REF1}$.

In some implementations, the first input current $I_1$ can also be provided to an input of a second Schmitt trigger 38b of the compare circuit 32. The second Schmitt trigger 38b can be configured to generate a second compare signal based on a comparison of the first input current $I_1$ and a second reference current $I_{REF2}$. The second compare signal can be indicative of whether the first input current $I_1$ is greater than the second reference current $I_{REF2}$. The second compare signal can be a binary signal. In some implementations, one or more compare signals can be generated based on the comparison of the first input current $I_1$ and the second reference current $I_{REF2}$. In some of these implementations, at least one of the one or more compare signals can be based on the first compare signal and the second compare signal.

The logic control 39 can perform any suitable logic function on the first compare signal and the second compare signal to control any of the illustrated current dividers 34a-34c. According to certain implementations, the logic control 39 includes digital CMOS logic.

It will be understood that any suitable number of Schmitt triggers, other suitable circuit configured to compare two or more different currents, reference currents, or any combination thereof can be implemented in accordance with the principles and advantages described herein. One or more of the reference currents, such as $I_{REF1}$ and/or $I_{REF2}$, can be programmable to any suitable current level for a desired application. For instance, the first reference current $I_{REF1}$ and the second reference current $I_{REF2}$ can each be set to different current levels.

A first current divider 34a can divide the first input current $I_1$ by a first division ratio k to generate a first divided current $I_1/k$. In some implementations, the first current divider 34a can include a current mirror configured to decode the rate of the first input current $I_1$, for example, based on one or more of the compare signals described earlier. The first divided current $I_1/k$ can be provided to the core current multiplier 36. The first current divider 34a can adjust the first division ratio k based on the first compare signal and/or the second compare signal. For instance, when the first input current $I_1$ is less than $I_{REF1}$, k can be set to a value that is lower than when the first input current $I_1$ is greater than $I_{REF1}$ based on the first compare signal. Alternatively or additionally, when the first input current $I_1$ is less than $I_{REF2}$, k can be set to a value that is lower than when the first input current $I_1$ is greater than $I_{REF2}$ based on the second compare signal. Thus, the first division ratio k can be adjusted based on the current level of the first input current $I_1$. By adjusting the first division ratio k, the output current Iout can be kept within a predetermined range as the first input current $I_1$ varies.

A second current divider 34b can divide the second input current $I_2$ by a second division ratio m to generate a second divided current $I_2/m$. In some implementations, the second current divider 34b can include a current mirror configured to decode the rate of the first input current $I_1$, for example, based on one or more compare signals described earlier. The second divided current $I_2/m$ can be provided to the core current multiplier 36 to perform the current multiplication described earlier. In some implementations, the second current divider 34b can adjust the second division ratio m based on the first compare signal and/or the second compare signal. For instance, when the first input current $I_1$ is less than $I_{REF1}$, m can be set to a value that is lower than when the first input current $I_1$ is greater than $I_{REF1}$ based on the first compare signal. Alternatively or additionally, when the first input current $I_1$ is less than $I_{REF2}$, m can be set to a value that is lower than when the first input current $I_1$ is greater than $I_{REF2}$ based on the second compare signal. Thus, the second division ratio m can be adjusted based on the current level of the first input current Adjusting the second division ratio m in combination with adjusting the first division ratio k can further compensate for variation in the first input current $I_1$ compared to embodiments in which only the first division ration k or the second division ratio m are adjusted. In some other implementations, the second division ratio m can remain fixed.

A third current divider 34c can divide the third input current $I_3$ by a third division ratio n to generate a third divided current $I_3/n$. In some implementations, the third current divider 34c can include a current mirror configured to decode the rate of $I_1$, for example, based on one or more compare signals described earlier. The third divided current $I_3/n$ can be provided to the core current multiplier 36 to perform the current multiplication described earlier. In some implementations, the third divider 34c can adjust the third division ratio n based on first compare signal and/or the second compare signal. For instance, when the first input current $I_1$ is less than $I_{REF1}$, n can be set to a value that is lower than when the first input current $I_1$ is greater than $I_{REF1}$ based on the first compare signal. Alternatively or additionally, when the first input current $I_1$ is less than $I_{REF2}$, n can be set to a value that is lower than when the first input current $I_1$ is greater than $I_{REF2}$ based on the second compare signal. Thus, the third division ratio n can be adjusted based on the current level of the first input current $I_1$. Adjusting the third division ratio n in combination with adjusting at least one of the first division ratio k and the second division ratio m can further compensate for variation in the first input current $I_1$ compared to embodiments in which only one of the first, second, or third division ratios are adjusted. In other implementations, the third division ratio n can remain fixed.

Accordingly, the current multiplier 30 can be adjusted and/or optimized according to different ranges of the first input current $I_1$. This can lead to avoiding the engineering tradeoffs between variation, high temp compensation, linearity, the like, or any combination thereof. In fact, simulation results have shown that standard deviation of the Iout can be reduced by about 30-50% in some implementations compared to comparable conventional current multipliers. Variation in Iout can depend on the range of first input current $I_1$. Moreover, simulations results indicate that yields for parts meeting certain Iout specifications can be increased by about 30-50% compared to some comparable conventional CMOS current multipliers for the same Iout specifications when the first input current $I_1$ varies within a relatively wide range. Simulation results also show linearity remaining substantially the same with relatively high temperature compensation for Iout.

Advantageously, the current multiplier 30 shown in FIG. 3E can be implemented without additional input or output bits from external to the current multiplier 30, such as from a baseband processor to produce the output current Iout within a specified range.

The logic control 39 can generate logic signals based on the first compare signal and/or the second compare signal. These logic signals can be provided to, for example, a power amplifier bias and control logic block 40. The generated logic signals can be combined with a band select signal and/or a mode select signal in the power amplifier bias and control logic block 40. Accordingly, the power amplifier bias and control logic block 40 can provide a tailored bias for a power amplifier for twice as many modes for each extra bit generated based on one of the compare signals. For instance, with one extra bit generated based on a comparison performed by a Schmitt trigger, a tailored bias for the power amplifier can be provided for 8 different modes instead of 4 modes. In particular, one mode control bit, one band control bit, and one bit generated based on the compare circuit 32 can select 1 of 8 different modes of operation. Other control functions at different bands and/or modes can also be controlled at least in part by at least one of the compare signals. Thus, using one or more compare signals in the power amplifier bias controller can simplify the design for a multi-mode multi-band (MMMB) power amplifier module, such as the power amplifier module 20 of FIG. 2. For example, the interface between a baseband processor, which can be the processor 8 of FIG. 1 in some implementations, and the power amplifier module (PAM) can be simplified since fewer control signals can be provided from the baseband processor. This can reduce the PAM size. In some implementations, reducing the PAM size can also reduce the size of a phone board, which can be desirable in an MMMB smart phone system.

Figure 5:
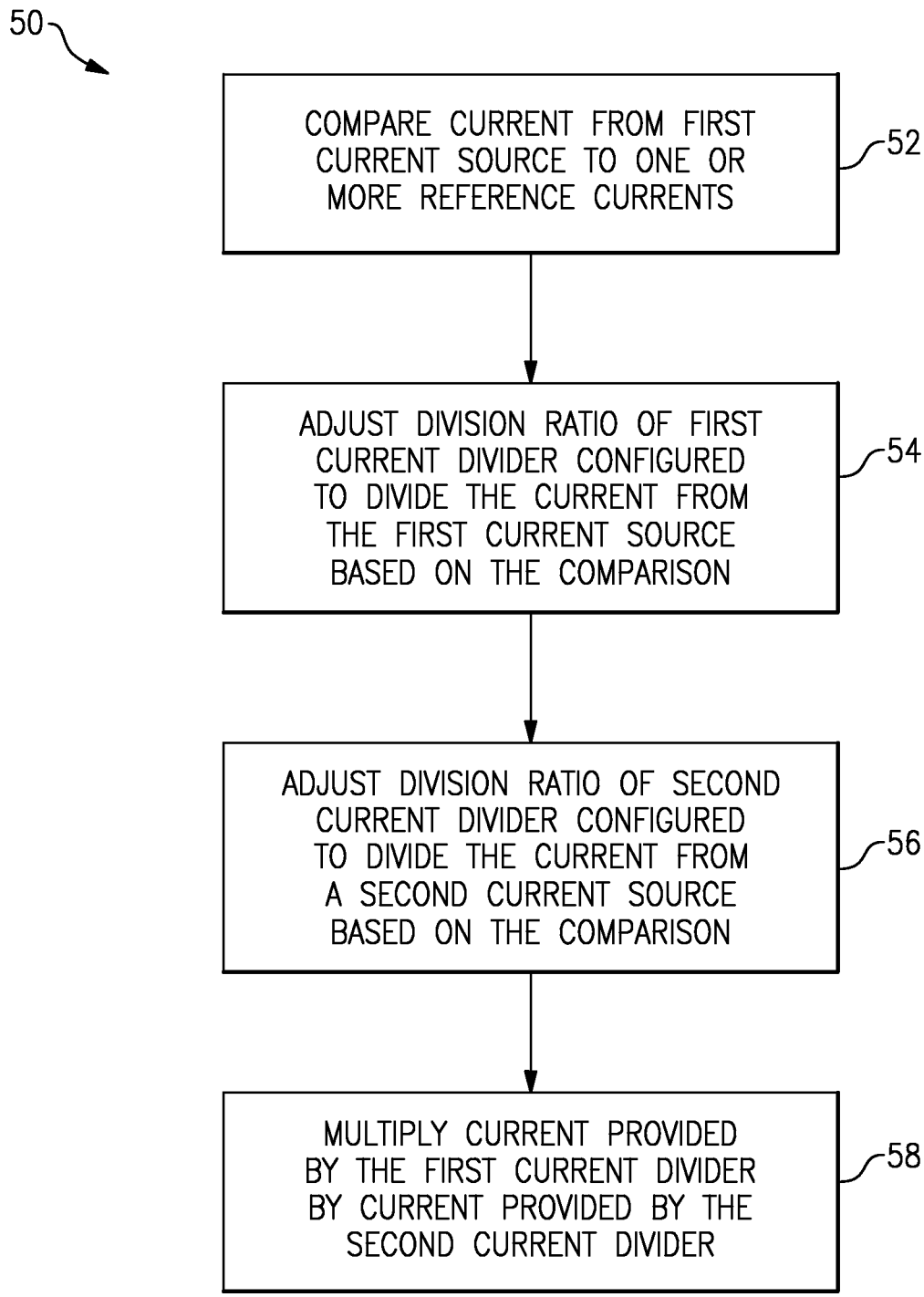
FIG. 5 is a flow diagram of illustrative methods of generating a current with high linearity and/or high temperature compensation according yet another embodiment.

FIG. 5 is a flow diagram of an illustrative method 50 that can generate a current with high linearity and/or high temperature compensation according to certain embodiments. The method 50 can be executed in connection with any of the principles and advantages of the current multipliers described herein. In some implementations, the method of FIG. 5 can be implemented by any combination of features of the circuits of any of FIGS. 3A-3E. Any combination of the features of the method 50 may be embodied in instructions stored on a non-transitory computer readable medium. When executed, the non-transitory computer readable medium may cause some or all of the method 50 to be performed. It will be understood that any of the methods discussed herein may include greater or fewer operations and the operations may be performed in any order, as appropriate.

Referring to the flow diagram of FIG. 5, a current from a first current source can be compared to one or more reference currents at block 52. The first current source can have a relatively wide variation. For instance, the first current source can vary within a range that spans one, two, or three orders of magnitude of the lowest current value in the range. In some implementations, the first current source can provide the first input current $I_1$ described earlier to a current multiplier. The one or more reference currents can each be programmable to a suitable current level for a desired application. The comparison can be executed by a Schmitt trigger or any other suitable compare circuit.

Based on the one or more comparisons at block 52, a first division ratio of a first current divider can be adjusted at block 54. This can adjust how much the current from the first current source is divided before being multiplied by another current. As a result, adjusting the division ratio can compensate at least in part for variation in current from the first current source while still maintaining a desired characteristic of the output current of the current multiplier. Such compensation can be dynamic. The current generated by the current divider with the adjustable division ratio can be provided to a core current multiplier.

According to certain implementations, a second division ratio of a second current divider can be adjusted at block 56 based on the one or more comparisons at block 52. This can also adjust how much current from a second current source is divided before being multiplied by another current based on the variation of current from the first current source. The second current source can be separate and/or independent from the first current source. It will be understood that the one or more comparisons at block 52 can be used to adjust any suitable number of division ratios in different current dividers. It will also be understood that the one or more comparisons at block 52 can be used to perform other functionalities in an electronic system. For instance, based on the one or more comparisons, a power amplifier can be biased for a selected mode of operation.

At block 56, a core current multiplier can multiply the current generated by the first current divider by a different current, such as the current generated by the second current divider. The different current can be generated by a second current source that is separate from and/or independent of the first current source. The core current multiplier can also multiply and/or divide these currents by any suitable number of other currents. For instance, the core current multiplier can implement any combination of features described with reference to the core current multipliers discussed herein. An output current generated by the core current multiplier at block 56 can be used in a wide variety of applications including, for example, biasing a power amplifier.

Overview of Wireless Devices

Any of the systems, methods, apparatus, and computer-readable media related to the current multipliers described herein can be implemented in a variety of electronic devices, such as a wireless device, which can be a mobile device. FIG. 1 schematically depicts a wireless device 1. Examples of the wireless device 1 include, but are not limited to, a cellular phone (e.g., a smart phone), a laptop, a tablet computer, a personal digital assistant (PDA), an electronic book reader, and a portable digital media player. For instance, the wireless device 1 can be a multi-band and/or multi-mode device such as a multi-band/multi-mode mobile phone configured to communicate using, for example, Global System for Mobile (GSM), code division multiple access (CDMA), 3G, 4G, and/or long term evolution (LTE).

In certain embodiments, the wireless device 1 can include one or more of a RF front end 2, a transceiver component 3, an antenna 4, power amplifiers 5, a control component 6, a computer readable medium 7, a processor 8, a battery 9, and supply control block 10.

The transceiver component 3 can generate RF signals for transmission via the antenna 4. Furthermore, the transceiver component 3 can receive incoming RF signals from the antenna 4.

It will be understood that various functionalities associated with the transmission and receiving of RF signals can be achieved by one or more components that are collectively represented in FIG. 1 as the transceiver 3. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 1 as the antenna 4. For example, a single antenna can be configured to provide both transmitting and receiving functionalities. In another example, transmitting and receiving functionalities can be provided by separate antennas. In yet another example, different bands associated with the wireless device 1 can be provided with different antennas.

In FIG. 1, one or more output signals from the transceiver 3 are depicted as being provided to the antenna 4 via one or more transmission paths. In the example shown, different transmission paths can represent output paths associated with different bands and/or different power outputs. For instance, the two example power amplifiers 5 shown can represent amplifications associated with different power output configurations (e.g., low power output and high power output), and/or amplifications associated with different bands.

In FIG. 1, one or more detected signals from the antenna 4 are depicted as being provided to the transceiver 3 via one or more receiving paths. In the example shown, different receiving paths can represent paths associated with different bands. For example, the four example paths shown can represent quad-band capability that some wireless devices are provided with.

To facilitate switching between receive and transmit paths, the RF front end 2 can be configured to electrically connect the antenna 4 to a selected transmit or receive path. Thus, the RF front end 2 can provide a number of switching functionalities associated with an operation of the wireless device 1. In certain embodiments, the RF front end 2 can include a number of switches configured to provide functionalities associated with, for example, switching between different bands, switching between different power modes, switching between transmission and receiving modes, or some combination thereof. The RF front end 2 can also be configured to provide additional functionality, including filtering of signals. For example, the RF front end can include one or more duplexers.

The wireless device 1 can include one or more power amplifiers 5. RF power amplifiers can be used to boost the power of a RF signal having a relatively low power. Thereafter, the boosted RF signal can be used for a variety of purposes, included driving the antenna of a transmitter. Power amplifiers 5 can be included in electronic devices, such as mobile phones, to amplify a RF signal for transmission. For example, in mobile phones having a an architecture for communicating under the 3G and/or 4 G communications standards, a power amplifier can be used to amplify a RF signal. It can be desirable to manage the amplification of the RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot. A power amplifier module can include one or more power amplifiers.

FIG. 1 shows that in certain embodiments, a control component 6 can be provided, and such a component can be configured to provide various control functionalities associated with operations of the RF front end 2, the power amplifiers 5, the supply control 10, and/or other operating component(s). In some implementations, the control component 6 can include one or more current multipliers that include any combination of features described herein. Non-limiting examples of the supply control 10 are described herein in greater detail.

In certain embodiments, a processor 8 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 7 that can direct a computer or other programmable data processing apparatus to operate in a particular manner, such that the instructions stored in the computer-readable memory produce an article of manufacture including instructions which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide operations for implementing the acts specified in the flowchart and/or block diagram block or blocks.

The illustrated wireless device 1 also includes the supply control block 10, which can be used to provide a power supply to one or more of the power amplifiers 5. For example, the supply control block 10 can include one or more current multipliers that include any combination of features described herein and/or a DC-to-DC converter. In certain embodiments the supply control block 10 can alternatively or additionally include other blocks, such as, for example, an envelope tracker configured to vary the supply voltage provided to the power amplifiers 5 based upon an envelope of the RF signal to be amplified.

The supply control block 10 can be electrically connected to the battery 9, and the supply control block 10 can be configured to vary the voltage provided to the power amplifiers 5 based on an output voltage of a DC-DC converter. The battery 9 can be any suitable battery for use in the wireless device 1, including, for example, a lithium-ion battery. By varying the voltage provided to the power amplifiers, the power consumption of the battery 9 can be reduced, thereby improving performance of the wireless device 1.

Overview of Power Amplifier Module

Any of the systems, methods, apparatus, and computer-readable media related to the current multipliers described herein can be implemented a power amplifier module according to certain implementations. Power amplifier modules include power amplifiers that can boost the power of a radio frequency (RF) signal having a relatively low power. Thereafter, the boosted RF signal can be used for a variety of purposes, such as driving the antenna of a transmitter. Power amplifiers can be used in a variety of RF wireless communications devices, such as the wireless device 1 of FIG. 1. As one example, power amplifiers can be included in mobile phones to amplify an RF signal for transmission.

Figure 2:
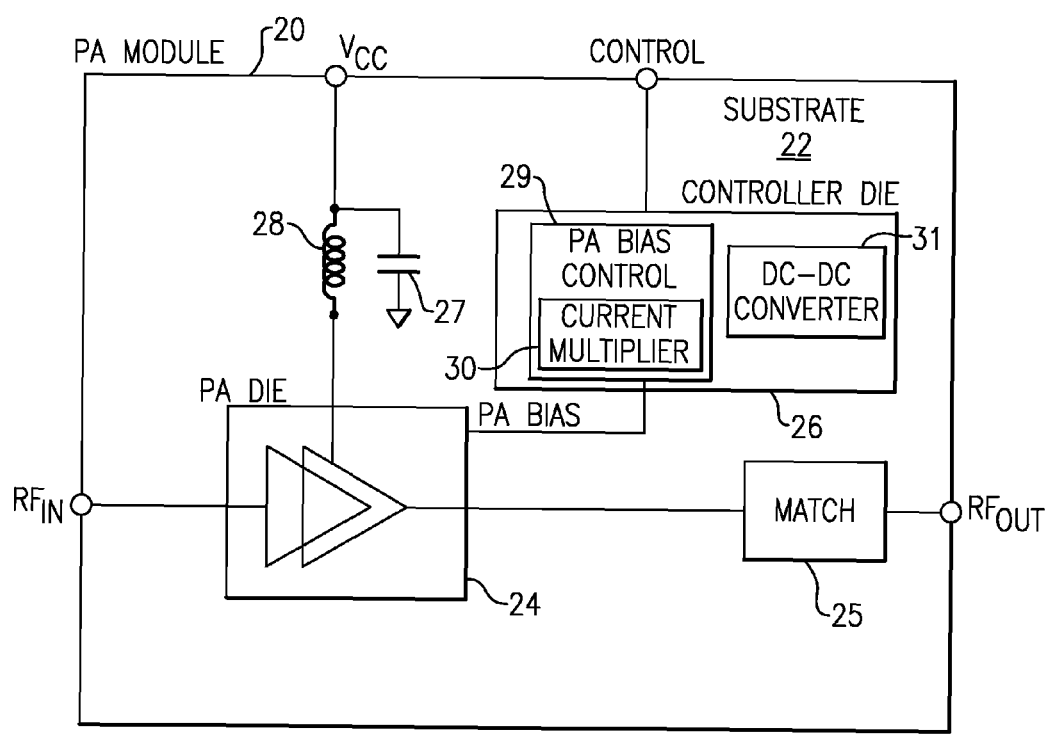
FIG. 2 is a schematic block diagram of an illustrative power amplifier module.

FIG. 2 is a schematic block diagram of an illustrative power amplifier module 20. The illustrated power amplifier module 20 is a multi-chip module (MCM) that can include a controller die 26, a power amplifier die 24, one or more inductors 28, one or more capacitors 27, a matching component 25, or any combination thereof. In certain implementations, the power amplifier module 20 can be a multi-mode multi-band (MMMB) power amplifier module. An MMMB power amplifier module can operate at one of a number of frequency bands and at one of a number of modes for the selected frequency band. For instance, an MMMB power amplifier module can operate at high band mode 1 base on a control signal provided from the bias and control logic block 40 of FIG. 3E.

The power amplifier module 20 can include a plurality of dies and/or other components attached to and/or coupled to the substrate 22. The other components can include, for example, surface mount components (SMCs) and/or components formed from the substrate 22, such as inductors formed from one or more substrate traces. In some implementations, the substrate 22 can be a multi-layer substrate configured to support die and/or components and to provide electrical connectivity to external circuitry when the module 20 is mounted on a circuit board, such as a phone board. Thus, the substrate 22 can be configured to receive a plurality of components, such as die and/or separate passive components. As illustrated in FIG. 2, the power amplifier die 24, the power amplifier bias control die 26, a capacitor 27, and an inductor 28 are attached to the substrate 22. The substrate 22 can be a laminate substrate with a finish plating.

The power amplifier die 24 can receive a RF signal on an input pin $RF_{IN}$ of the power amplifier module 20. The power amplifier die 24 can include one or more power amplifiers 5, including, for example, multi-stage power amplifiers configured to amplify the RF signal. The amplified RF signal can be provided to an output pin $RF_{OUT}$ of the power amplifier module 20. The matching component 25 can match an output impedance of the power amplifier. The matching component 25 can be provided on the power amplifier module 20 to aid in reducing signal reflections and/or other signal distortions. The power amplifier die 24 can be any suitable die for implementing a power amplifier. In some implementations, the power amplifier die is a gallium arsenide (GaAs) die. In some of these implementations, the GaAs die includes transistors formed using a heterojunction bipolar transistor (HBT) process.

The power amplifier module 20 can also include a $V_{CC}$ pin, which can be electrically connected to the controller die 26 (not illustrated). The power amplifier module 20 can include a capacitor 27 and/or an inductor 28, which can be mounted to the substrate 22 and/or implemented on the substrate 22. For instance, the inductor 28 can be implemented on the substrate 22 as a trace on the substrate 22 or as a surface mount component (SMC) mounted to the substrate 22. The inductor 28 can operate as a choke inductor, and can be disposed between a supply voltage received on a supply voltage pin $V_{CC}$ and the power amplifier die 24. The inductor 28 can provide a power amplifier on the power amplifier die 24 with a supply voltage received on the supply voltage pin $V_{CC}$ while choking and/or blocking high frequency RF signal components. The inductor 28 can include a first end electrically connected to the supply voltage pin $V_{CC}$, and a second end electrically connected to a collector of a bipolar transistor associated with the power amplifier die 24. The capacitor 27 can function as a decoupling capacitor. As illustrated in FIG. 2, the capacitor 27 includes a first end electrically connected to the first end of the inductor 28 and a second end electrically coupled to ground, which in certain implementations is provided using a ground pin of the power amplifier module 20 (not illustrated). The capacitor 27 can provide a low impedance path to high frequency signals, thereby reducing the noise of the power amplifier supply voltage, improving power amplifier stability, and/or improving the performance of the inductor 28 as a RF choke. In some implementations, the capacitor 27 can include a SMC.

Figure 4:
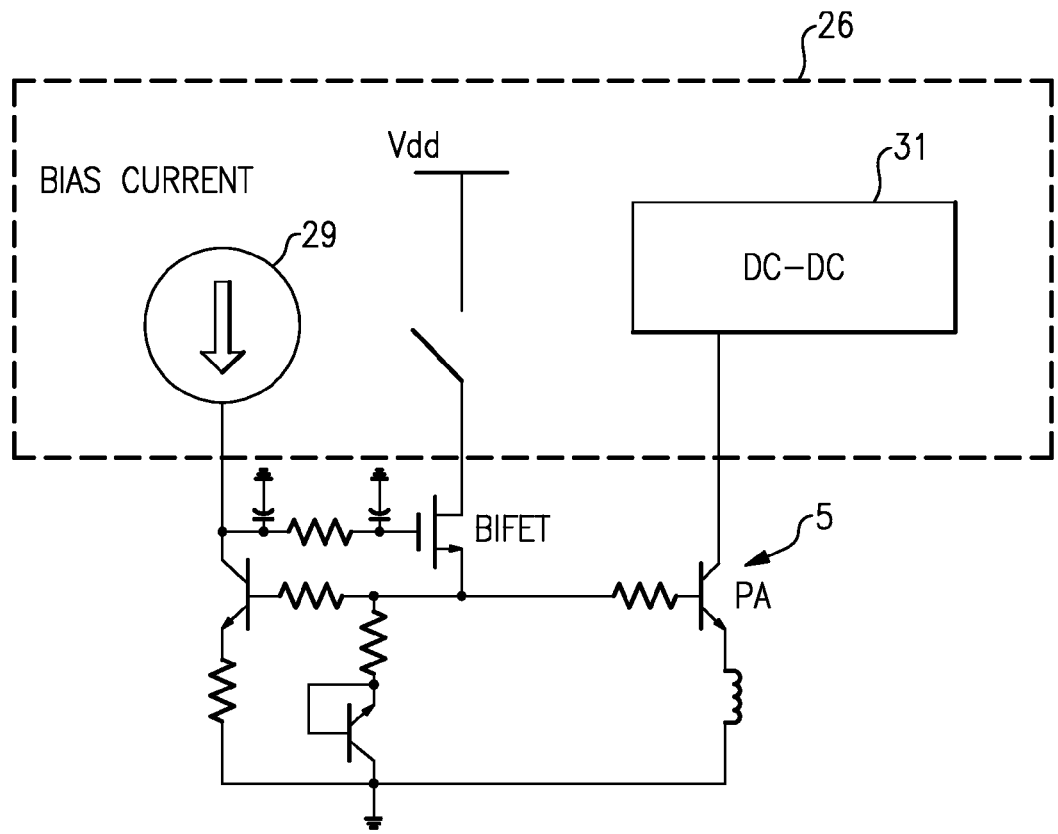
FIG. 4 illustrates a schematic of an illustrative bias control scheme for a power amplifier in which the bias current can be controlled by any of the current multipliers of FIGS. 3A-3E.

In some implementations, the controller die can be manufactured on a silicon wafer. In some of these implementations, the controller die can be manufactured using complementary metal oxide semiconductor (CMOS) process technology. The controller die 26 can include a power amplifier bias control block 29 and/or a DC-DC converter block 31. The power amplifier bias control block 29 can include a current multiplier 30 with any combination of features of the current multipliers described herein. The power amplifier bias control block 29 can be used, for example, to provide bias signals to the power amplifier die, such as the output current Iout of a current multiplier 30. As shown in FIG. 4, in a bipolar transistor power amplifier configuration, the controller die 26 can be used to provide a reference voltage for biasing a current mirror used to generate a base current for a power amplifier, such as a base current for a bipolar transistor. The controller die 26 can also be used to enable and/or disable a power amplifier disposed on the power amplifier die 24, which can aid in selectively activating a power amplifier associated with a particular transmission path. For example, the controller die 26 can receive one or more control signals on one or more pins CONTROL, and can use the one or more control signal to vary the bias signal provided to the power amplifier die so as to selectively enable or disable the power amplifier. The one or more control signals can include a mode select signal to select a particular mode of operation of the power amplifier, such a low power mode, a medium power mode, or a high power mode. Alternatively or additionally, the one or more control signals can include a band select signal to select a high band mode of operation of the power amplifier or a low band mode of operation of the power amplifier.

The power amplifier module 20 can be modified to include more or fewer components, including, for example, additional power amplifier dies, capacitors and/or inductors. For instance, the power amplifier module 20 can include an additional power amplifier die, as well as an additional capacitor and inductor configured to operate as an LC circuit disposed between the additional power amplifier die and the $V_{CC}$ pin of the power amplifier module 20. The power amplifier module 20 can be configured to have additional pins, such as in implementations in which a separate power supply is provided to an input stage disposed on the power amplifier die and/or implementations in which the multi-chip module operates over a plurality of bands.

Power Amplifier Bias Control

FIG. 4 illustrates an example schematic of a bias control circuit for a power amplifier 5. The output current Iout of the current multiplier 30 including any combination of features of the current multipliers described herein can be implemented as the current source to bias the power amplifier 5. The output current Iout of the current multiplier 30 can be use by the bias control circuit to bias the power amplifier 5. In particular, the base of a bipolar transistor of the power amplifier 5 can be biased based on output current Iout of the current multiplier 30, for example, in accordance with the circuit shown in FIG. 4. The output current Iout of any of the current multipliers 30 described herein can reduce or eliminate one or more of the following: gain variations of the power amplifier 5, gain slope issues related to the power amplifier 5, or other metrics by which the power amplifier 5 is rated.

Applications

Some of the embodiments described herein have provided examples in connection with wireless devices, such as mobile phones, that include power amplifiers. However, the principles and advantages of the embodiments can be used in connection with any other systems or apparatus that have needs for current multiplication, for example, needs for high linearity current multiplication and/or current multiplication with high temperature compensation. At the same time, low variation, low cost objectives can be achieved in such current multipliers.

Such systems that include one or more current multipliers can be implemented in various electronic devices. Examples of electronic devices can include, but are not limited to, consumer electronic products, parts of the consumer electronic products, electronic test equipment, etc. The consumer electronic products can include, but are not limited to, a mobile phone (e.g., a smart phone), a telephone, a television, a computer monitor, a computer, a hand-held computer, a tablet computer, a laptop computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Part of the consumer electronic products can include a multi-chip module (for example, a power amplifier module, which can be a converged multimode multiband power amplifier module in certain implementations), other electronic modules, an integrated circuit including a current multiplier, etc. Moreover, other examples of the electronic devices can also include, but are not limited to, memory chips, memory modules, circuits of optical networks or other communication networks, and disk driver circuits. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A current multiplier comprising:
a compare circuit configured to compare a first current from a first current source with a reference current and generate one or more compare signals based on comparing the first current from the first current source with the reference current;
a current divider configured to adjust a division ratio based on at least one of the one or more compare signals and divide a current divider input current by the division ratio to generate a divided output current; and
a core current multiplier configured to generate a current multiplier output current based on multiplying the divided output current by a different current.

2. The current multiplier of claim 1 wherein the current divider input current is based on the first current.

3. The current multiplier of claim 1 wherein the current multiplier is implemented with complementary metal oxide semiconductor (CMOS) circuit elements.

4. The current multiplier of claim 1 wherein the current multiplier is implemented in a power amplifier control circuit.

5. The current multiplier of claim 4 wherein the power amplifier control circuit is configured to select one of a plurality of different modes of the power amplifier based on at least one of the one or more compare signals.

6. The current multiplier of claim 1 further comprising a second current divider configured to adjust a second division ratio based on at least one of the one or more compare signals and generate the different current based on dividing current from a second current source by the second division ratio.

7. The current multiplier of claim 1 further comprising a second current divider configured to adjust a second division ratio and generate the different current, the core current multiplier configured to generate the current multiplier output current based on the product of the first divided output current and the second current divided by a third current.

8. The current multiplier of claim 7 further comprising a third current divider configured to adjust a third division ratio and generate the third current based on dividing current from a third current source by the third division ratio.

9. The current multiplier of claim 1 wherein the first current is configured to vary by at least about two orders of magnitude.

10. The current multiplier of claim 1 wherein the current multiplier is configured to maintain a linearity of the output current within +/−3% across the range of the first current.

11. The current multiplier of claim 1 wherein the current multiplier is configured to perform temperature compensation of about 5% to 60% on the output current.

12. The current multiplier of claim 1 wherein the compare circuit includes a Schmitt trigger configured to compare the first current with the reference current.

13. The current multiplier of claim 1 wherein the compare circuit is further configured to compare the first current with a second reference current and generate the one or more compare signals based on comparing the first current with the second reference current, the second reference current being independent of the first current source.

14. The current multiplier of claim 1 wherein the current divider includes a current mirror configured to decode a current range of the first current.

15. A power amplifier module comprising:
a power amplifier die including a power amplifier configured to amplify an input signal and to generate an amplified output signal; and
a complementary metal oxide semiconductor (CMOS) controller die including a current divider configured to adjust a division ratio based on a comparison of a first current from a first current source and a reference current and generate a divided current based on the division ratio; and a core current multiplier configured to generate an output current based on multiplying the divided current by a current generated based on a second current source, the power amplifier on the power amplifier die configured to be biased based on the output current of the core current multiplier.

16. The power amplifier module of claim 15 wherein the power amplifier includes a GaAs transistor.

17. The power amplifier module of claim 15 wherein a mode of the power amplifier is configured to be selected based on the comparison and at least one of a mode select signal and a band select signal.

18. The power amplifier module of claim 15 wherein the CMOS controller die further includes a second current divider configured to adjust a second division ratio based on a comparison of the first current from the first current source and a second reference current and generate a second divided current based on dividing the second current by the second division ratio.

19. The power amplifier module of claim 15 wherein the current divider is further configured to adjust the division ratio based on a second comparison of the first current from the first current source and a second reference current.

20. A method of multiplying current comprising:
comparing current from a first current source to a reference current;
adjusting a division ratio of a current divider configured to divide current from the first current source based on the comparing; and
multiplying a current generated by the current divider by at least one current generated from a second current from a second current source separate from the first current source.

21. A wireless device comprising:
a battery configured to power the wireless device;
a power amplifier die configured to amplify a radio frequency (RF) input signal and to generate an amplified RF signal;
an antenna configured to transmit the amplified RF signal; and
a CMOS controller die including a core current multiplier configured to generate an output current by multiplying a first divided current and a second current, and a current divider configured to generate the first divided current by dividing a first current from a first current source by an adjustable division ratio so as to keep the output current of the core current multiplier within a predetermined range as the current from the current source varies.

22. A current multiplier comprising:
a core current multiplier configured to generate an output current based on multiplying a divided current and a different current; and
a current divider configured to generate the divided current by dividing a current from a current source by an adjustable division ratio so as to keep the output current of the core current multiplier within a predetermined range as the current from the current source varies.

23. The current multiplier of claim 22 wherein the current divider is configured keep the output current of the core current multiplier within a predetermined range as the current from the current source varies on the order of at least two orders of magnitude.

* * * * *